(12) United States Patent
Ito

(10) Patent No.: US 12,446,400 B2
(45) Date of Patent: Oct. 14, 2025

(54) DISPLAY DEVICE AND METHOD FOR MANUFACTURING DISPLAY DEVICE

(71) Applicant: SHARP KABUSHIKI KAISHA, Sakai (JP)

(72) Inventor: Kazuatsu Ito, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 599 days.

(21) Appl. No.: 17/802,096

(22) PCT Filed: Mar. 30, 2020

(86) PCT No.: PCT/JP2020/014460
§ 371 (c)(1),
(2) Date: Aug. 24, 2022

(87) PCT Pub. No.: WO2021/199112
PCT Pub. Date: Oct. 7, 2021

(65) Prior Publication Data
US 2023/0082769 A1    Mar. 16, 2023

(51) Int. Cl.
*H01L 27/32* (2006.01)
*H01L 51/56* (2006.01)
(Continued)

(52) U.S. Cl.
CPC ..... *H10K 59/1213* (2023.02); *H10D 30/6755* (2025.01); *H10D 86/423* (2025.01);
(Continued)

(58) Field of Classification Search
CPC ........... H10D 30/6734; H10D 30/6757; H10K 59/121; H10K 59/1213
See application file for complete search history.

(56) References Cited

U.S. PATENT DOCUMENTS 6,653,657 B2 * 11/2003 Kawasaki .......... H10D 30/6739
257/E29.279
2005/0156514 A1    7/2005 Park
(Continued)

FOREIGN PATENT DOCUMENTS

JP    2011-112723 A    6/2011
WO    2014/021150 A1   2/2014

OTHER PUBLICATIONS

International Searching Authority, Written Opinion of the International Searching Authority, International application No. PCT/JP2020/014460, Jun. 16, 2020, all pages. (Year: 2020).*
(Continued)

*Primary Examiner* — Victoria K. Hall
(74) *Attorney, Agent, or Firm* — ScienBiziP, P.C.

(57) ABSTRACT

A display device includes a light-emitting element including a first electrode, a second electrode, and a light-emitting layer provided between the first electrode and the second electrode, and a drive transistor that drives the light-emitting element, wherein the drive transistor includes a source electrode, a drain electrode, and a semiconductor layer, one of the source electrode and the drain electrode is electrically connected to the first electrode, the semiconductor layer includes a first channel region close to a high-potential side electrode among the source electrode and the drain electrode, and a second channel region separated from the first channel region via a conductive region, and when a direction from the source electrode to the drain electrode is referred to as a channel direction, a length of the first channel region in the channel direction is shorter than a length of the second channel region in the channel direction.

17 Claims, 10 Drawing Sheets

(51) Int. Cl.
*H10D 30/67* (2025.01)
*H10D 86/40* (2025.01)
*H10K 59/121* (2023.01)
*H10K 71/00* (2023.01)
*H10D 86/60* (2025.01)
*H10K 59/12* (2023.01)

(52) U.S. Cl.
CPC ......... *H10K 71/00* (2023.02); *H10D 30/6734* (2025.01); *H10D 30/6745* (2025.01); *H10D 30/6757* (2025.01); *H10D 86/60* (2025.01); *H10K 59/1201* (2023.02)

(56) References Cited

U.S. PATENT DOCUMENTS

| | | | |
|---|---|---|---|
| 2009/0261337 A1* | 10/2009 | Sakakura | H10D 30/673 257/66 |
| 2011/0122324 A1 | 5/2011 | Yamashita et al. | |
| 2013/0126873 A1 | 5/2013 | Yang et al. | |
| 2015/0138183 A1 | 5/2015 | Kishi et al. | |
| 2017/0236947 A1 | 8/2017 | Zhang | |
| 2018/0012946 A1* | 1/2018 | Bang | H10D 30/6713 |

OTHER PUBLICATIONS

International Searching Authority, International Search Report, International application No. PCT/JP2020/014460, Jun. 16, 2020, all pages. (Year: 2020).*

* cited by examiner

DISPLAY DEVICE AND METHOD FOR MANUFACTURING DISPLAY DEVICE

TECHNICAL FIELD

The disclosure relates to a display device and a method for manufacturing the display device.

BACKGROUND ART

PTL 1 discloses a pixel circuit for driving an organic EL element. The pixel circuit described in PTL 1 includes a drive transistor and a writing transistor. The drive transistor includes a drain electrode or a source electrode connected to an anode electrode of the organic EL element, and controls a current flowing through the organic EL element. The writing transistor includes a drain electrode or source electrode connected to a gate electrode of the drive transistor, and switches on (conductive state) and off (non-conductive state) of the drive transistor.

CITATION LIST

Patent Literature

PTL 1: JP 2011-112723 A

SUMMARY

Technical Problem

For example, a drive transistor for controlling a current flowing through a light-emitting element such as an organic EL element is required to have a characteristic in which a current change with respect to a voltage change is small in IV (current-voltage) characteristic in order to stabilize the current flowing through the light-emitting element. In addition, the drive transistor is required to have a small shift amount of a threshold voltage for switching on and off. An aspect of the disclosure is to suppress the current change with respect to the voltage change of the drive transistor and to suppress the shift amount of the threshold voltage of the drive transistor.

Solution to Problem

A display device according to an aspect of the disclosure includes a light-emitting element including a first electrode, a second electrode, and a light-emitting layer provided between the first electrode and the second electrode, and a drive transistor that drives the light-emitting element, wherein the drive transistor includes a source electrode, a drain electrode, a semiconductor layer, and a first gate electrode, one of the source electrode and the drain electrode is electrically connected to the first electrode, the semiconductor layer includes a first channel region close to a high-potential side electrode having a high potential among the source electrode and the drain electrode, and a second channel region separated from the first channel region via a conductive region, and when a direction from the source electrode to the drain electrode is referred to as a channel direction, a length of the first channel region in the channel direction is shorter than a length of the second channel region in the channel direction.

A method for manufacturing a display device according to an aspect of the disclosure includes forming a drive transistor, and forming a light-emitting element driven by the drive transistor, wherein the forming the drive transistor includes forming a semiconductor layer, forming a first gate electrode, forming a drain electrode and a source electrode, and forming a channel region in the semiconductor layer, the forming the light-emitting element includes forming a first electrode electrically connected to one of the source electrode and the drain electrode, forming a light-emitting layer overlapping the first electrode, and forming a second electrode, the light-emitting layer being between the first electrode and the second electrode, the forming the channel region includes forming, in the semiconductor layer, a first channel region close to a high-potential side electrode having a high potential among the source electrode and the drain electrode, and a second channel region separated from the first channel region via a conductive region, and when a direction from the source electrode to the drain electrode is referred to as a channel direction, the first channel region having a length in the channel direction shorter than a length of the second channel region in the channel direction is formed.

Advantageous Effects of Disclosure

According to an aspect of the disclosure, a display device and a method for manufacturing the display device can be obtained in which the display device suppresses a current change with respect to a voltage change of the drive transistor, and suppresses a shift amount of a threshold voltage of the drive transistor.

DESCRIPTION OF EMBODIMENTS

Embodiment

Figure 1:
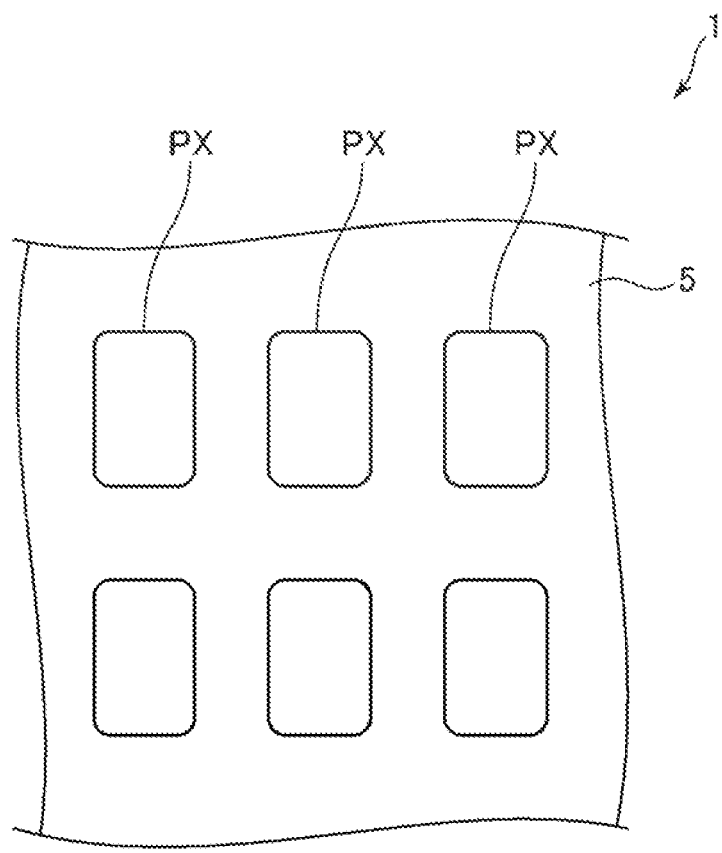
FIG. 1 is an enlarged plan view of a part of a display region in a display device 1 according to an embodiment.

FIG. 1 is an enlarged plan view of a part of a display region 5 in a display device 1 according to an embodiment. The display device 1 includes, for example, the display region 5 that is a region for displaying an image, and a frame region (not illustrated) surrounding the display region 5 in a frame-like shape. In the display region 5, a plurality of pixels PX are provided in a matrix shape. The plurality of pixels PX include, for example, a red pixel that emits red light, a green pixel that emits green light, and a blue pixel that emits blue light. The display device 1 includes a light-emitting element and a pixel circuit that drives the light-emitting element, provided for each of the plurality of pixels PX.

Figure 2:
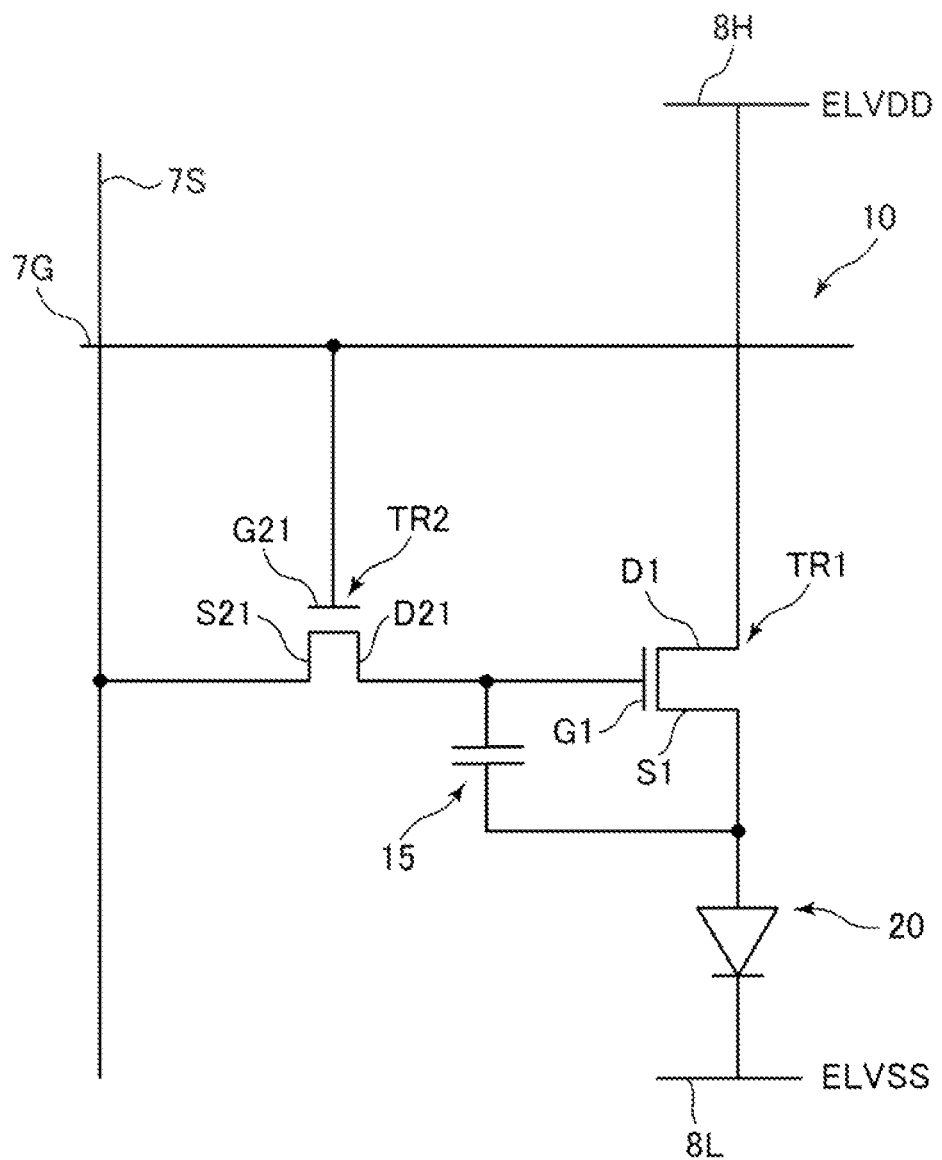
FIG. 2 is a diagram illustrating an example of an equivalent circuit around a pixel circuit and a light-emitting element in a display device according to the embodiment.

FIG. 2 is a diagram illustrating an example of an equivalent circuit around a pixel circuit and a light-emitting element in a display device 1 according to the embodiment. As illustrated in FIG. 2, the display device 1 includes, for example, a plurality of source wiring lines 7S, a plurality of gate wiring lines 7G, a high-level power source line 8H, a low-level power source line 8L, a pixel circuit 10, and a light-emitting element 20.

The plurality of source wiring lines 7S and the plurality of gate wiring lines 7G are provided so as to intersect each other in the display region 5. Each of the plurality of source wiring lines 7S is connected to a source driver (not illustrated), and a source signal corresponding to emission luminance of each of the plurality of pixels PX is supplied from the source driver. Each of the plurality of gate wiring lines 7G is connected to a gate driver (not illustrated), and a gate signal for selecting a pixel PX to be emitted from among the plurality of pixels PX is supplied from the gate driver. ELVSS having a constant low potential is applied to the low-level power source line 8L. ELVDD having a high constant potential higher than the ELVSS is applied to the high-level power source line 8H.

The pixel circuit 10 and the light-emitting element 20 are provided for each of the plurality of pixels PX. The pixel circuit 10 includes a drive transistor TR1, a selection transistor TR2, and a capacitance element 15.

In the drive transistor TR1, for example, a first gate electrode G1 is connected to a drain electrode D21 of the selection transistor TR2 and one electrode of the capacitance element 15, a drain electrode D1 is connected to the high-level power source line 8H, and the source electrode S1 is connected to an anode electrode of the light-emitting element 20 and the other electrode of the capacitance element 15.

In other words, in the present embodiment, as an example, description is made assuming that when a current is supplied to the light-emitting element 20 (in other words, when the light-emitting element 20 emits light), in the drive transistor TR1, the drain electrode D1 is a high-potential side electrode having a high potential, and the source electrode S1 is a low-potential side electrode having a low potential.

Note that, in the drive transistor TR1, the drain electrode D1 and the source electrode S1 may be reversed. In other words, in the drive transistor TR1, the source electrode (high-potential side electrode) S1 may be connected to the high-level power source line 8H, and the drain electrode (low-potential side electrode) D1 may be connected to the anode electrode of the light-emitting element 20 and the other electrode of the capacitance element 15.

In the selection transistor TR2, a gate electrode G21 is connected to the gate wiring line 7G, and a drain electrode D21 is connected to the first gate electrode G1 of the drive transistor TR1 and the one electrode of the capacitance element 15, and a source electrode S21 is connected to the source wiring line 7S.

In the capacitance element 15, the one electrode is connected to the first gate electrode G1 of the drive transistor TR1 and the drain electrode D21 of the selection transistor TR2, and the other electrode is connected to the source electrode S1 of the drive transistor TR1 and the anode electrode of the light-emitting element 20.

In the light-emitting element 20, the anode electrode is connected to the source electrode S1 of the drive transistor TR1 and the other electrode of the capacitance element 15, and a cathode electrode is connected to the low-level power source line 8L.

The light-emitting element 20 is a so-called current control light-emitting element in which luminance is controlled in accordance with a current flowing between the anode electrode and the cathode electrode. For example, the light-emitting element 20 is an Organic Light Emitting Diode (OLED) element or a Quantum-dot Light Emitting Diode (QLED) element in which the light-emitting layer includes a semiconductor nanoparticle material (quantum dot material).

When an on-level gate signal is supplied from the gate wiring line 7G to the gate electrode G21 of the selection transistor TR2, the selection transistor TR2 switches from off (non-conductive state) to on (conductive state). Then, the source signal is supplied from the source wiring line 7S to the capacitance element 15 via the source electrode S21 and the drain electrode D21 of the selection transistor TR2, and is supplied as the gate input signal to the first gate electrode G1 of the drive transistor TR1. When the drive transistor TR1 is switched from off (non-conductive state) to on (conductive state) by the on-level gate input signal, a current flows from the drain electrode D1 of the drive transistor TR1 to the source electrode S1, and further the current flows through the light-emitting element 20. Thus, the light-emitting element 20 emits light.

Figure 3:
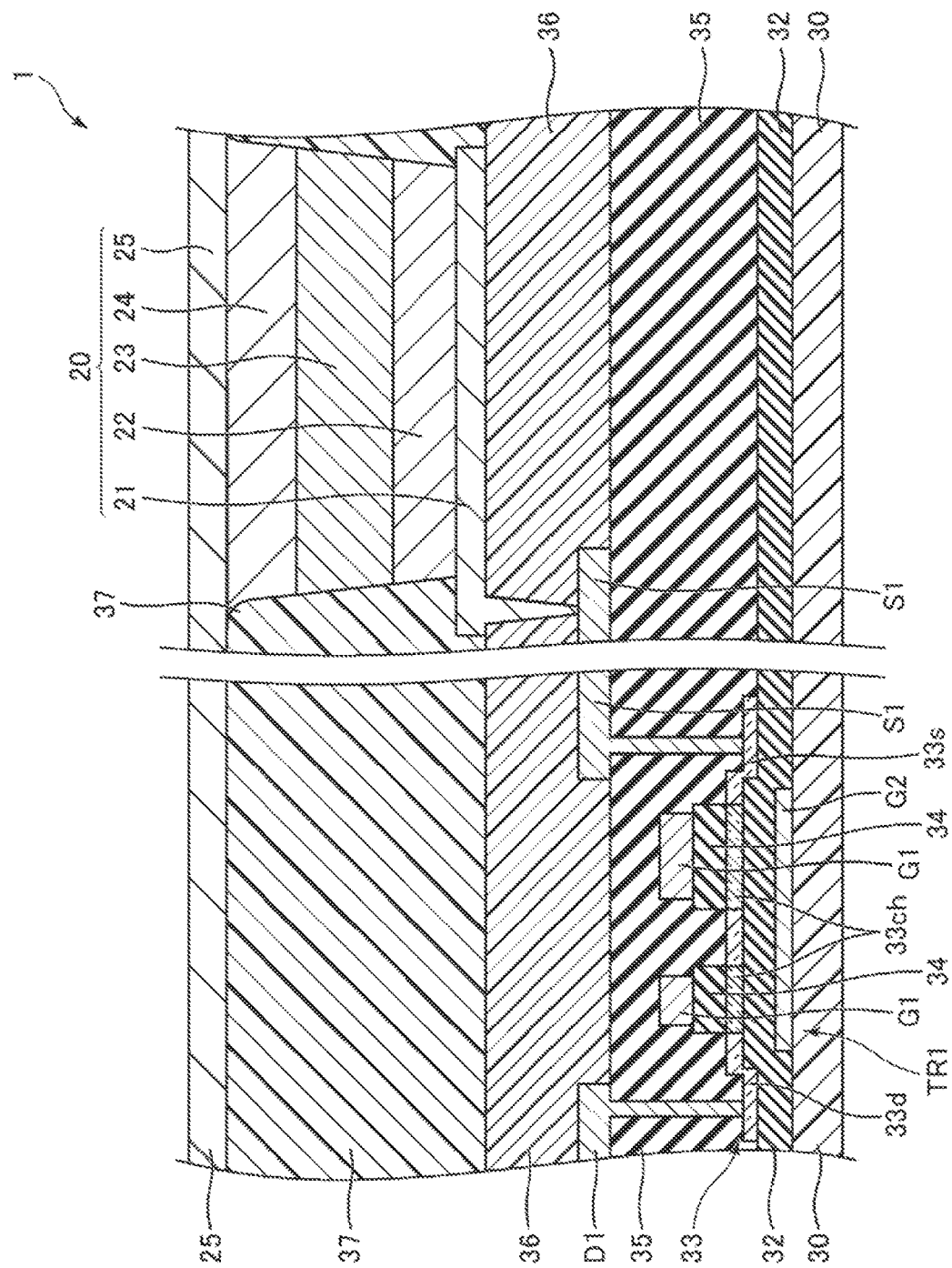
FIG. 3 is a cross-sectional view illustrating an example of a schematic configuration of a drive transistor and the light-emitting element of the display device according to the embodiment.

FIG. 3 is a cross-sectional view illustrating an example of a schematic configuration of the drive transistor TR1 and the light-emitting element 20 of the display device 1 according to the embodiment.

The display device 1 includes, for example, a base material 30, the drive transistor TR1 provided on the base material 30, a flattened layer 36 that covers the drive transistor TR1, an edge cover 37 and the light-emitting element 20 provided on the flattened layer 36, and a sealing layer (not illustrated) that covers the edge cover 37 and the light-emitting element 20.

The base material 30 is formed of, for example, a hard material such as glass or a material having flexibility. Examples of the material having flexibility include, for example, resin materials such as PET (polyethylene terephthalate) or polyimide. Note that an insulating layer formed of an inorganic material or an organic material may be layered on a main surface of the base material 30.

In the present embodiment, an example in which the drive transistor TR1 has a top gate structure will be mainly described. The drive transistor TR1 includes, for example, a second gate electrode G2, a first insulating layer 32, a semiconductor layer 33, a gate insulating layer 34, a first gate electrode G1, a second insulating layer 35, and the drain electrode D1 and the source electrode S1, which are layered in order on the base material 30.

The second gate electrode G2 is provided on the base material 30 so as to interpose the semiconductor layer 33 between the second gate electrode G2 and the first gate electrode G1. In other words, the second gate electrode G2 is provided on an opposite side of the first gate electrode G1 with respect to the semiconductor layer 33. For example, the second gate electrode G2 is a so-called back gate electrode. The second gate electrode G2 stabilizes a voltage between the second gate electrode G2 and the first gate electrode G1, the first gate electrode G1 being provided to face the second gate electrode G2 via the semiconductor layer 33. The second gate electrode G2 functions to shield the electric field from the outside to the semiconductor layer 33 during operation of the drive transistor TR1. Thus, the second gate electrode G2 allows a current flowing through the semiconductor layer 33 to be uniform, and suppresses fluctuation in the threshold voltage for switching on and off of the drive transistor TR1, thus improving the reliability of the operation of the drive transistor TR1.

A constant fixed voltage (for example, a ground voltage such as 0 V) is preferably applied to the second gate electrode G2. This allows the threshold voltage for switching on and off of the drive transistor TR1 to be stabilized, thus enabling stable switching of on and off of the drive transistor TR1. Note that the second gate electrode G2 may be in an electrically floating state without being applied with a voltage.

The semiconductor layer 33 may be either an n-channel type or a p-channel type, but in the present embodiment, the semiconductor layer 33 is described as being an n-channel type as an example. The semiconductor layer 33 is formed using various semiconductor materials, but in the present embodiment, the semiconductor layer 33 is described as being an oxide semiconductor as an example.

The oxide semiconductor includes, for example, at least one metal element selected from In, Ga, and Zn. For example, the oxide semiconductor includes an In—Ga—Zn—O based semiconductor (an indium gallium zinc oxide). The semiconductor layer 33 includes a channel region 33ch, and a drain region 33d and a source region 33s that are both ends of the channel region 33ch. The channel region 33ch is a region (semiconductor region) where the oxide semiconductor is not reduced in resistance, and the drain region 33d and the source region 33s are regions (conductive regions) where the oxide semiconductor is reduced in resistance.

The first insulating layer 32 covers the second gate electrode G2 provided on the base material 30, and is layered on the entire surface of the main surface on the base material 30. The gate insulating layer 34 is disposed between the semiconductor layer 33 and the first gate electrode G1 and is layered in an island shape on the semiconductor layer 33. The second insulating layer 35 covers the semiconductor layer 33 and the first gate electrode G1 and is layered on the entire surface on the first insulating layer 32. In other words, the first insulating layer 32 and the second insulating layer 35 are layered not only on a region where the drive transistor TR1 is formed but also on a lower layer of a region where the light-emitting element 20 is formed.

Each of the first insulating layer 32, the gate insulating layer 34, and the second insulating layer 35 is formed of an insulating material, and is an inorganic insulating layer formed of, for example, an inorganic material such as silicon nitride, silicon oxide, and silicon oxynitride. Note that each of the first insulating layer 32, the gate insulating layer 34, and the second insulating layer 35 may have a single layer structure or may have a multi-layer structure.

The drain electrode D1 and the source electrode S1 are provided on the second insulating layer 35. The drain electrode D1 is connected to the drain region 33d in the semiconductor layer 33 through a contact hole formed in the second insulating layer 35. The source electrode S1 is connected to the source region 33s in the semiconductor layer 33 through a contact hole formed in the second insulating layer 35.

Each of the first gate electrode G1, the second gate electrode G2, the drain electrode D1, and the source electrode S1 is formed of a conductive material. Examples of the conductive material include metal materials such as aluminum, tungsten, molybdenum, tantalum, chromium, titanium, and copper, or an alloy thereof.

The second gate electrode G2, the semiconductor layer 33, the gate insulating layer 34, the first gate electrode G1, the drain electrode D1, and the source electrode S1 are patterned in a formation region of the drive transistor TR1. Note that details of the drive transistor TR1 will be described later with reference to FIGS. 4 and 5.

The flattened layer 36 is layered on the second insulating layer 35 in order to level unevenness of a surface of the second insulating layer 35. The flattened layer 36 covers the drain electrode D1 and the source electrode S1 and is layered on the entire surface of the second insulating layer 35. In other words, the flattened layer 36 is layered not only on the region where the drive transistor TR1 is formed but also on the lower layer of the region where the light-emitting element 20 is formed. The flattened layer 36 is formed of an insulating material and is an organic insulating layer formed of, for example, an organic material such as a polyimide resin and an acrylic resin.

The edge cover 37 and the light-emitting element 20 are layered on the flattened layer 36. The light-emitting element 20 includes, for example, a first electrode 21, a first charge injection layer 22, a light-emitting layer 23, a second charge injection layer 24, and a second electrode 25 layered in order from the flattened layer 36. For example, the first electrode 21, the first charge injection layer 22, the light-emitting layer 23, and the second charge injection layer 24 are provided in an island shape for each light-emitting element 20. The second electrode 25 is provided on the entire surface of the second charge injection layer 24 and the edge cover 37.

The edge cover 37 covers a peripheral portion (edge portion) of the first electrode 21. Thus, the edge cover 37 prevents a short-circuit between the peripheral portion of the first electrode 21 and the second electrode 25.

The edge cover 37 is provided in a lattice pattern in the display region 5 (see FIG. 1) in a plan view. In other words, the light-emitting element 20 provided in an opening surrounded by the edge cover 37 corresponds to the pixel PX (see FIG. 1). The edge cover 37 is an organic insulating layer formed of, for example, an organic material such as a polyimide resin and an acrylic resin.

The first electrode 21 is connected to the source electrode S1 through a contact hole formed in the flattened layer 36. The first electrode 21 is, for example, an anode electrode. For example, the first electrode 21 corresponds to an anode electrode in the equivalent circuit of the light-emitting element 20 illustrated in FIG. 3.

The first electrode 21 is, for example, a reflective electrode that reflects visible light. The first electrode 21 is configured as a layered structure of, for example, a reflective layer containing a metal material such as aluminum, copper, gold, or silver having high reflectivity of visible light, and a transparent layer containing ITO, IZO, ZnO, AZO, BZO, or GZO, which is a transparent material. Note that the first electrode 21 may have a single layer structure including the reflective layer.

The second electrode 25 is, for example, a cathode electrode. For example, the second electrode 25 corresponds to a cathode electrode in the equivalent circuit of the light-emitting element 20 illustrated in FIG. 3. The second electrode 25 is, for example, a transparent electrode that transmits visible light. The second electrode 25 contains, for example, ITO, IZO, ZnO, AZO, BZO, or GZO, which is a transparent material.

The first charge injection layer 22 is provided between the first electrode 21 and the light-emitting layer 23. The first charge injection layer 22 is, for example, a hole injection layer for injecting positive holes into the light-emitting layer 23.

The second charge injection layer 24 is provided between the second electrode 25 and the light-emitting layer 23. The second charge injection layer 24 is, for example, an electron injection layer for injecting electrons into the light-emitting layer 23. Note that other layers such as a hole transport layer may be provided between the first charge injection layer 22 and the light-emitting layer 23. Other layers such as an electron transport layer may be provided between the second charge injection layer 24 and the light-emitting layer 23.

The light-emitting layer 23 is provided between the first electrode 21 and the second electrode 25. Specifically, the light-emitting layer 23 according to the present embodiment is provided between the first charge injection layer 22 and the second charge injection layer 24. The light-emitting layer 23 emits visible light based on, for example, the positive holes injected from the first charge injection layer 22 and the electrons injected from the second charge injection layer 24. For example, the light-emitting layer 23 emits red light, green light, or blue light. The light-emitting layer 23, for example, may be an organic EL layer containing an organic EL material, or may be a quantum dot layer containing a plurality of quantum dots that emit electro-luminescence (EL) light.

Note that the layering order of the light-emitting element 20 is not limited to the order described above. For example, the first electrode 21 may be the cathode electrode, the first charge injection layer 22 may be the electron injection layer, the second charge injection layer 24 may be the hole injection layer, and the second electrode 25 may be the anode electrode. The first electrode 21 may be the transparent electrode and the second electrode 25 may be the reflective electrode.

Figure 4:
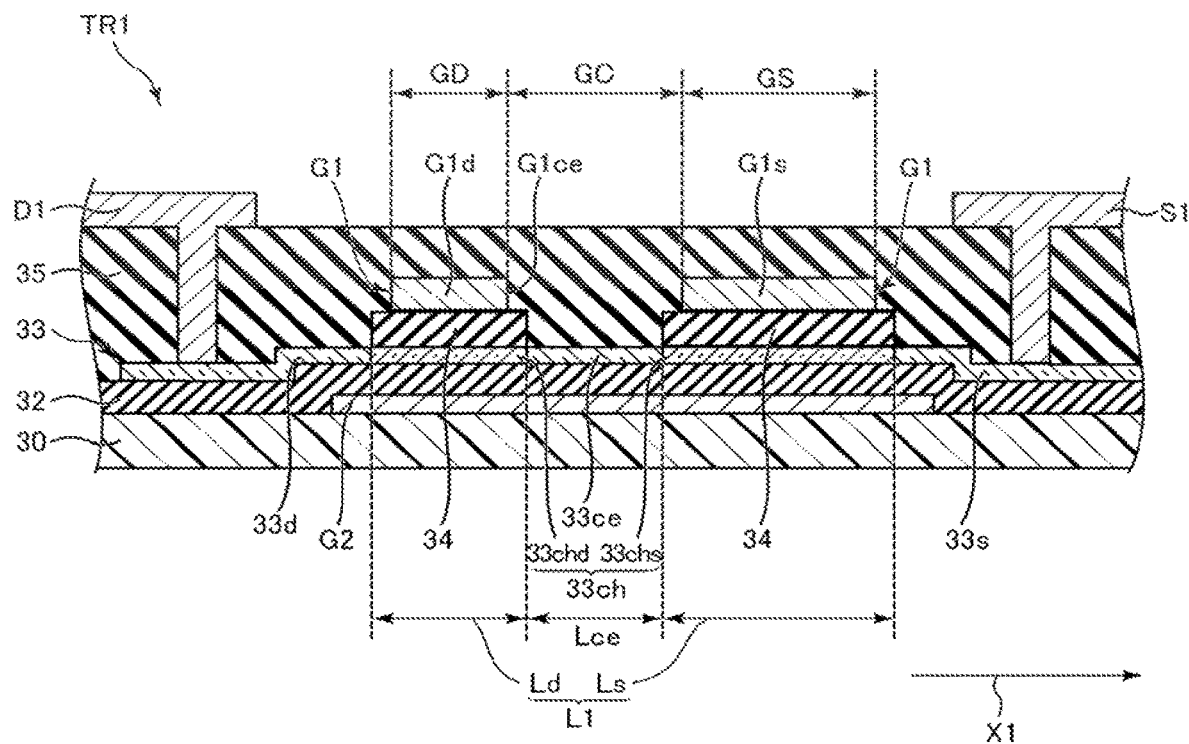
FIG. 4 is a cross-sectional view illustrating a schematic configuration of the drive transistor in the display device according to the embodiment.
Figure 5:
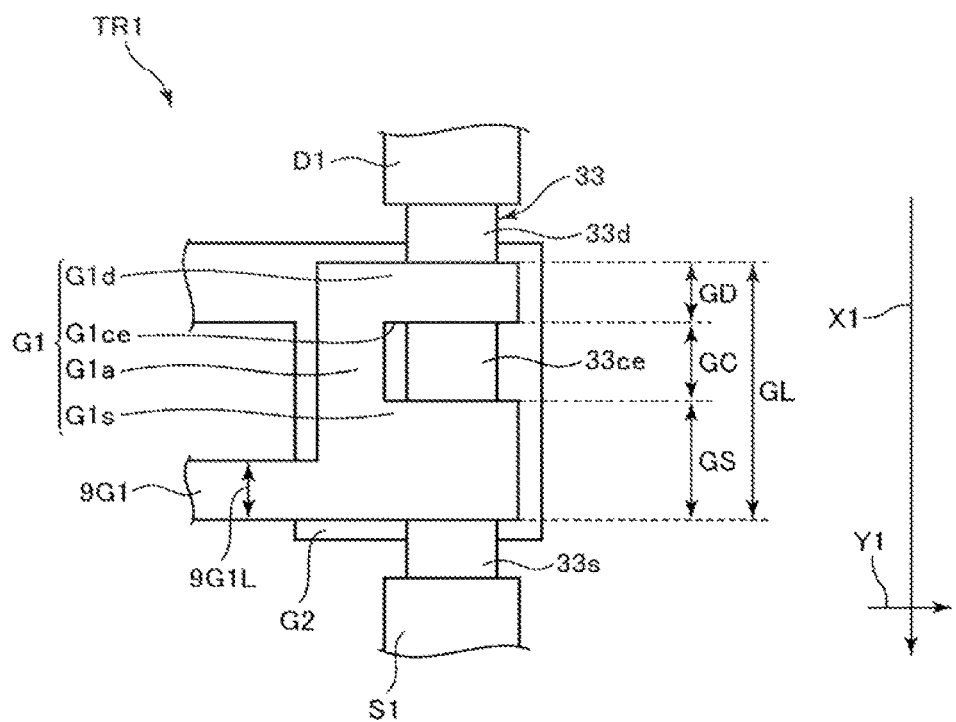
FIG. 5 is a plan view illustrating the schematic configuration of the drive transistor illustrated in FIG. 4.

With reference to FIGS. 4 and 5, details of the drive transistor TR1 will be described. FIG. 4 is a cross-sectional view illustrating a schematic configuration of the drive transistor TR1 in the display device 1 according to the embodiment. FIG. 5 is a plan view illustrating a schematic configuration of the drive transistor TR1 illustrated in FIG. 4. Note that in FIG. 5, illustrations of the base material 30, the first insulating layer 32, the gate insulating layer 34, and the second insulating layer 35 in FIG. 4 are omitted.

As illustrated in FIGS. 4 and 5, when a direction from the drain electrode D1 to the source electrode S1 is referred to as a channel direction X1, the semiconductor layer 33 of the drive transistor TR1 is provided to extend in the channel direction X1.

The semiconductor layer 33 includes, in addition to the drain region 33$d$ and the source region 33$s$, a conductive region 33$ce$ that is a region where the oxide semiconductor is reduced in resistance. The channel region 33$ch$ includes a first channel region 33$chd$ on a side close to the drain electrode D1 having a high potential, and a second channel region 33$chs$ on a side close to the source electrode S1 having a low potential. The second channel region 33$chs$ is separated from the first channel region 33$chd$ via the conductive region 33$ce$. A length GD of the first channel region 33$chd$ in the channel direction X1 is shorter than a length GS of the second channel region 33$chs$ in the channel direction X1.

In the semiconductor layer 33, the first channel region 33$chd$ and the second channel region 33$chs$ are semiconductor regions in which the conductive state and the non-conductive state are switched in accordance with a gate input signal supplied to the first gate electrode G1.

The first channel region 33$chd$ and the second channel region 33$chs$ are formed, for example, by using the first gate electrode G1 as a mask, as described below. Therefore, for example, in the semiconductor layer 33, the first channel region 33$chd$ and the second channel region 33$chs$, which are semiconductor regions, overlap the first gate electrode G1. For example, in the semiconductor layer 33, the drain region 33$d$, the conductive region 33$ce$, and the source region 33$s$, which are conductive regions, do not overlap the first gate electrode G1.

The first gate electrode G1 is electrically connected to the wiring line 9G1 electrically connected to the drain electrode of the selection transistor TR2 (see FIG. 2) and the one electrode of the capacitance element 15. In other words, the first gate electrode G1 protrudes from the wiring line 9G1 and is provided in the formation region of the drive transistor TR1.

A part of the first gate electrode G1 overlaps the semiconductor layer 33. The first gate electrode G1 includes a base portion G1$a$ electrically connected to the wiring line 9G1 and a first region G1$d$ and a second region G1$s$ protruding from the base portion G1$a$ so as to intersect the semiconductor layer 33 in a plan view. The first region G1$d$ and the second region G1$s$ are separated from each other in the channel direction X1, and respective one ends are electrically connected to each other by the base portion G1$a$.

The first gate electrode G1 has a dual gate structure including, in a region overlapping the semiconductor layer 33, a first region G1$d$ close to the drain electrode D1 having a high potential and a second region G1$s$ separated from the first region G1$d$ via a notch G1$ce$. The length GD of the first region G1$d$ in the channel direction X1 is shorter than the length GS of the second region G1$s$ in the channel direction X1.

The first region G1$d$ and the second region G1$s$ are separated from each other in the channel direction X1 by a length GC of the notch G1$ce$ in the channel direction X1. In other words, the length GL of the base portion G1$a$ in the channel direction X1 is a length obtained by adding the length GD, the length GC, and the length GS.

For example, the first region G1d overlaps the first channel region 33chd in the semiconductor layer 33. For example, the second region G1s overlaps the second channel region 33chs in the semiconductor layer 33. For example, the notch G1ce overlaps the conductive region 33ce of the semiconductor layer 33. For example, the base portion G1a does not overlap the semiconductor layer 33.

For example, a length of the first gate electrode G1 in a direction Y1 orthogonal to the channel direction X1 is longer than a length of the semiconductor layer 33 (a length of the semiconductor layer 33 in the width direction) in a plan view. Furthermore, for example, the lengths of the first region G1d and the second region G1s in the direction Y1 orthogonal to the channel direction X1 are longer than the length of the semiconductor layer 33 (length of the semiconductor layer 33 in the width direction).

For example, the first gate electrode G1 has a shape in a plan view in which the notch G1ce is provided in a quadrangular shape covering the semiconductor layer 33. The notch G1ce is provided so as to intersect the semiconductor layer 33. A length of the notch G1ce in the direction Y1 is longer than a length of the semiconductor layer 33 in the direction Y1.

The gate insulating layer 34 is provided under the first gate electrode G1, and is patterned into a shape corresponding to the first gate electrode G1. For example, the gate insulating layer 34 is provided between the first channel region 33chd and the first region G1d, and between the second channel region 33chs and the second region G1s, on the semiconductor layer 33. For example, the gate insulating layer 34 is not provided on the drain region 33d, the conductive region 33ce, and the source region 33s, which are the conductive region, on the semiconductor layer 33.

The second gate electrode G2 covers the lower layer of the first gate electrode G1 via the semiconductor layer 33. The second gate electrode G2 has, for example, a quadrangular shape in a plan view.

In the second gate electrodes G2, for example, the length in the channel direction X1 and the length in the direction Y1 orthogonal to the channel direction X1 are both longer than the first gate electrode G1. In other words, an area of the second gate electrode G2 is greater than an area of the first gate electrode G1. For example, the first gate electrode G1 overlaps the second gate electrode G2 in a plan view, and is provided in the region of the second gate electrode G2. As a result, the voltage between the first gate electrode G1 and the second gate electrode G2 is more stable, and the reliability of the operation of the drive transistor TR1 is improved.

Here, in the drive transistor TR1 according to the present embodiment, a length L1 (channel length) of the channel region 33ch, in which the conductive state and the non-conductive state is switched by the first gate electrode G1, of the semiconductor layer 33 in the channel direction X1 is made long. The length GL of the first gate electrode G1 in the channel direction X1 is made long, in response to the long channel length of the channel region 33ch. For example, the length GL of the first gate electrode G1 in the channel direction X1 is longer than a length 9G1L of the wiring line 9G1 in the channel direction X1 (width of the wiring line 9G1). Furthermore, for example, a length obtained by combining the length GD of the first region G1d and the length GS of the second region G1s in the first gate electrode G1 is longer than the length 9G1L of the wiring line 9G1 in the channel direction X1.

As described above, in the drive transistor TR1, the channel length of the semiconductor layer 33 is long. With this, even if the voltage applied to the semiconductor layer 33 changes, the amount of the current flowing between the drain electrodes D1 and the source electrodes S1 is relatively less likely to change. In other words, even if the voltage applied to the semiconductor layer 33 changes, the amount of change in the current flowing through the semiconductor layer 33 with respect to the amount of change in the voltage can be suppressed.

As described above, the drive transistor TR1 among a plurality of transistors included in the pixel circuit 10 is a transistor electrically connected to the light-emitting element 20 emitted by current control and allowing a current to flow through the light-emitting element 20. Even if a change in voltage occurs in such a drive transistor TR1, the pixel circuit 10 can stably supply a current to the light-emitting element 20 via the drive transistor TR1 by suppressing the change in the current with respect to the change in the voltage of the drive transistor TR1. As a result, the pixel circuit 10 can allow the light-emitting element 20 to stably emit light.

Here, when the length of the channel region of the semiconductor layer is long, the semiconductor layer is likely to be vulnerable to electrical stress (for example, influence due to such as an electric field from the outside to the semiconductor layer). Thus, when the length of the channel region is long, the shift amount of the threshold voltage for turning the transistor on and off is likely to be large. As a result, a stable drive current cannot be obtained, and the reliability of the operation of the transistor may be decreased.

Furthermore, the threshold voltage for turning the transistor on and off is susceptible to influence of the electric field from an electrode on a high-potential side of the drain electrode and the source electrode, and the shift amount is also likely to be large due to the influence of the electric field. As a result, furthermore, a stable drive current cannot be obtained, and the reliability of the operation of the transistor is likely to be decreased.

Thus, in the drive transistor TR1 according to the present embodiment, in the channel region 33ch of the semiconductor layer 33, the first channel region 33chd and the second channel region 33chs are separated into the plurality of channel regions via the conductive region 33ce.

Accordingly, each of the channel lengths (each of the length Ld and the length Ls) of the first channel region 33chd and the second channel region 33chs, which are separated from each other, is shorter than that of a transistor in which the channel region is not separated into a plurality of regions.

Thus, according to the drive transistor TR1, the electrical stress (for example, influence due to the electric field from the outside to the semiconductor layer) of each of the first channel region 33chd and the second channel region 33chs can be increased as compared with a transistor having the same channel length (length obtained by adding the length Ld and the length Ls) in which the channel region is not separated into the plurality of regions.

Thus, according to the drive transistor TR1, the shift amount of the threshold voltage for turning the transistor on and off can be suppressed as compared with the transistor having the same channel length (length obtained by combining the length Ld and the length Ls) in which the channel region is not separated into the plurality of regions. As a result, decrease in the reliability of the operation of the drive transistor TR1 can be suppressed.

In addition, among the first channel region 33chd and the second channel region 33chs, which are the separated plurality of channel regions, the length Ld of the first channel region 33*chd* close to the drain electrode D1 having the high potential in the channel direction X1 is shorter than the length Ls of the second channel region 33*chs* close to the source electrode S1 having the low potential (in other words, far from the drain electrode D1 having the high potential) in the channel direction X1.

Thus, the first channel region 33*chd* close to the drain electrode D1 having the high potential can suppress the amount of shift of the threshold voltage caused by being influenced by the electric field from the drain electrode D1.

Thus, according to the drive transistor TR1, the shift amount of the threshold voltage for turning the transistor on and off can be suppressed as compared with the transistor having the same channel length (length obtained by combining the length Ld and the length Ls) in which the channel region is not separated into the plurality of regions. As a result, decrease in the reliability of the operation of the drive transistor TR1 can be suppressed.

On the other hand, in the second channel region 33*chs* far from the drain electrode D1 having the high potential, the length Ls (channel length of the second channel region 33*chs*) in the channel direction X1 is long. As a result, the current change with respect to the voltage change in the IV characteristic (current-voltage characteristic) in the second channel region 33*chs* can be suppressed. Thus, according to the drive transistor TR1, the current change with respect to the voltage change can be suppressed as compared with a transistor having a short channel length. In other words, even if the voltage applied to the second channel region 33*chs* fluctuates, the current flowing through the second channel region 33*chs* is less likely to fluctuate. Accordingly, the drive transistor TR1 can stably supply a current to the light-emitting element 20 to which current control is performed.

As described above, the drive transistor TR1 can suppress the current change with respect to the voltage change, and can suppress the shift amount of the threshold voltage.

In the drive transistor TR1 according to the present embodiment, the first gate electrode G1 includes the first region G1*d* close to the drain electrode D1 having the high potential and the second region G1*s* close to the source electrode S1 having the low potential, which are separated into the plurality of regions via a notch G1*ce*.

Thus, the drive transistor TR1 can suppress the shift amount of the threshold voltage for turning the transistor on and off as compared with the transistor including the gate electrode not separated into the plurality of regions. As a result, decrease in the reliability of the operation of the drive transistor TR1 can be suppressed.

In addition, among the first region G1*d* and the second region G1*s*, which are the separated plurality of regions, the length GD of the first region G1*d* close to the drain electrode D1 having the high potential in the channel direction X1 is shorter than the length GS of the second region G1*s* close to the source electrode S1 having the low potential (in other words, far from the drain electrode D1 having the high potential) in the channel direction XL.

Thus, the first region G1*d* close to the drain electrode D1 having the high potential can suppress the amount of shift of the threshold voltage caused by being influenced by the electric field from the drain electrode D1. As a result, decrease in the reliability of the operation of the drive transistor TR1 can be suppressed.

On the other hand, in the second region G1*s* far from the drain electrode D1 having the high potential, the length GS in the channel direction X1 is long. Thus, the change in the current flowing through the second channel region 33*chs* with respect to the voltage change of the second region G1*s* can be suppressed. Accordingly, the drive transistor TR1 can stably supply a current to the light-emitting element 20 to which current control is performed.

As a result, the drive transistor TR1 can further suppress the current change with respect to the voltage change, and can suppress the shift amount of the threshold voltage.

Note that the first gate electrode G1 may have a configuration that is not provided with the notch G1*ce*, and is not separated into the first region G1*d* and the second region G1*s*. In other words, the first gate electrode G1 may have, for example, a quadrangular shape, which is of the length GL in the channel direction X1. With this, the drive transistor TR1 can also suppress the current change with respect to the voltage change, and can suppress the shift amount of the threshold voltage as compared with the transistor in which the semiconductor layer is not separated in the channel direction.

In the channel region 33*ch* of the semiconductor layer 33, the length Ld of the first channel region 33*chd* may be shortened to be, for example, 10 μm or less. The length GD of the first region G id of the first gate electrode G1 may be shortened to be, for example, 10 μm or less. Thus, effect of suppressing the shift amount of the threshold voltage for turning the drive transistor TR1 on and off can be sufficiently obtained. As a result, decrease in the reliability of the operation of the drive transistor TR1 can be sufficiently suppressed.

In the channel region 33*ch* of the semiconductor layer 33, the length Ld of the first channel region 33*chd* may be lengthened to be, for example, 3 μm or greater. The length GD of the first region G1*d* of the first gate electrode G1 may be lengthened to be, for example, 3 μm or greater. As a result, a characteristic defect (defect of switching on and off) of the drive transistor TR1 caused by the length GD of the first region G1*d* or the length Ld of the first channel region 33*chd* being too short can be suppressed, and the drive transistor TR1 can be stably operated.

In the channel region 33*ch* of the semiconductor layer 33, the length Ls of the second channel region 33*chs* may be lengthened to be, for example, 1.5 times or more of the length Ld of the first channel region 33*chd*. The length GS of the second region G1*s* of the first gate electrode G1 may be lengthened to be, for example, 1.5 times or more of the length GD of the first region G1*d*. Thus, effect of suppressing the change in the current flowing through the second channel region 33*chs* with respect to the voltage change of the second region G1*s* can be sufficiently obtained. Accordingly, the drive transistor TR1 can further stabilize the current flowing through the light-emitting element 20 emitted by the current control, thereby allowing the light-emitting element 20 to stably emit light.

The length Lce of the conductive region 33*ce* of the semiconductor layer 33 in the channel direction X1 may be, for example, 2 μm or greater and 4 μm or less. The length GC of the notch G1*ce* of the first gate electrode G1 in the channel direction X1 may be, for example, 2 μm or greater and 4 μm or less. Accordingly, the drive transistor TR1 can be patterned with accuracy, and an area of the drive transistor TR1 in a plan view can be reduced.

Figure 6:
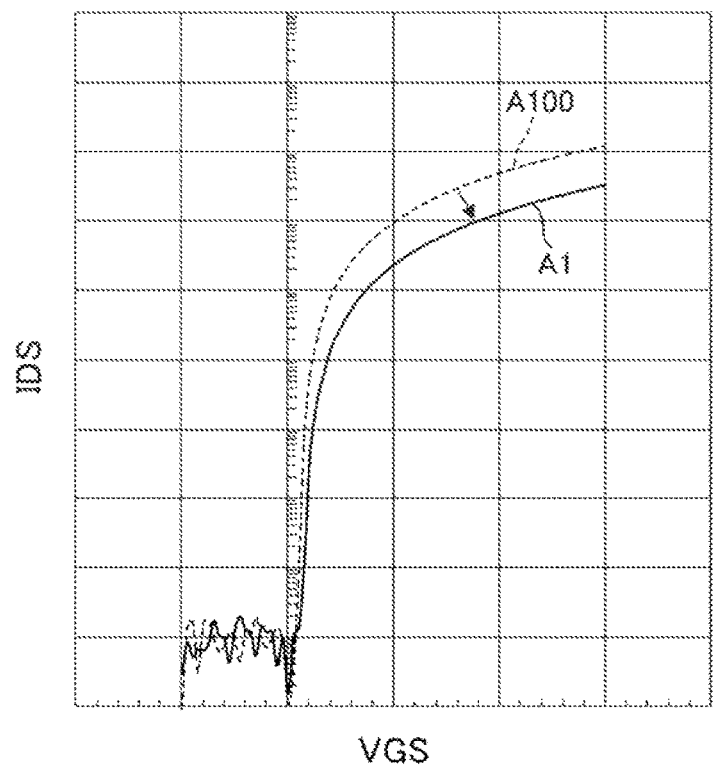
FIG. 6 is a diagram showing a graph of an experimental result related to an IV characteristic of the transistor.

Next, with reference to FIG. 6, experimental results indicating a relationship between the length of the channel length of the transistor and the current change with respect to the voltage change will be described. FIG. 6 is a diagram showing a graph of the experimental result related to an IV characteristic of the transistor. In the graph shown in FIG. 6, the horizontal axis represents the voltage of the gate electrode of the transistor. The vertical axis represents the amount of current flowing through the channel region in a direction from the drain electrode to the source electrode in the transistor.

In FIG. 6, a data series A100 indicated by a dashed line indicates experimental data representing an IV characteristic of the transistor having a short channel length of the channel region. In FIG. 6, in a data series A1 indicated by a solid line, experimental data is obtained by using a transistor having a channel length of the channel region longer than that of the transistor indicated by the data series A100.

As illustrated by an arrow in FIG. 6, it can be seen that the change in the IV characteristic is more gradual in the data series A1 than in the data series A100. In other words, it can be seen from the graph shown in FIG. 6 that the transistor having the long channel length indicated by the data series A1 can suppress the current change with respect to the voltage change more than the transistor having the short channel length indicated by the data series A100.

Figure 7:
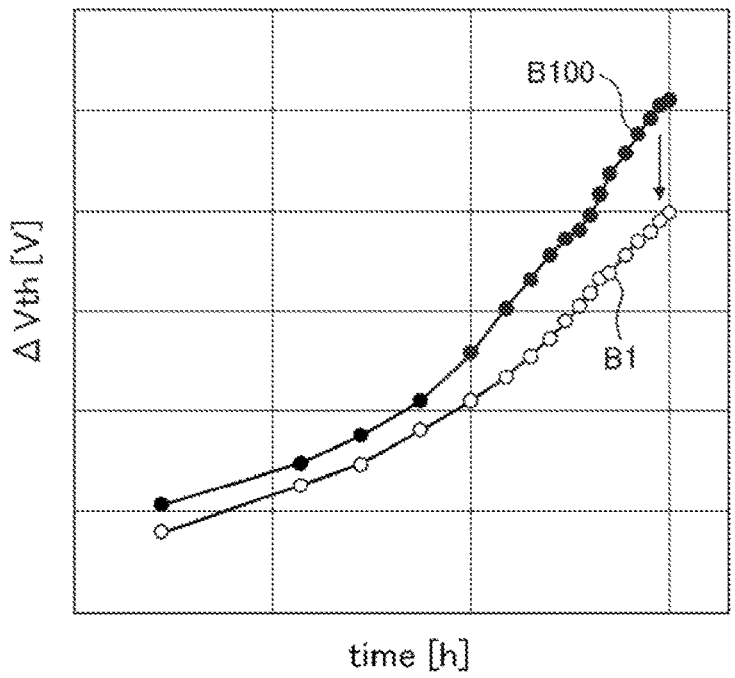
FIG. 7 is a diagram showing a graph of a shift amount of a threshold voltage for each elapsed time of the transistor.

With reference to FIG. 7, an experimental result indicating a relationship between the length of the channel length of the transistor and the shift amount of the threshold voltage will be described. FIG. 7 is a diagram showing a graph of the shift amount of the threshold voltage for each elapsed time of the transistor. In the graph shown in FIG. 7, the horizontal axis represents the elapsed time, and the vertical axis represents the shift amount of the threshold voltage.

In FIG. 7, each experimental data indicated by each of a data series B1 and B100 represents a change in the shift amount of the threshold voltage for each elapsed time when a positive voltage as an electrical stress is applied to the gate electrode of the transistor having the top gate structure. In the transistor indicated by the data series B1, experimental data is obtained using a transistor having the channel length of the channel region shorter than that of the transistor indicated by the data series B100.

As illustrated by an arrow in FIG. 7, it can be seen that the shift amount of the threshold voltage of the data series B1 is suppressed regardless of the elapsed time as compared with that of the data series B100. In other words, when the high potential is applied, the shift amount of the threshold voltage is suppressed in the transistor having the long channel length indicated by the data series B1 more than in the transistor having the short channel length indicated by the data series B100. Thus, the stability of the operation is conceived to be enhanced.

It can be seen from the experimental results shown in FIGS. 6 and 7 that the current change with respect to the voltage change can be suppressed and the shift amount of the threshold voltage can be suppressed by, as in the drive transistor TR1, separating the channel region 33ch into the first channel region 33chd and the second channel region 33chs via the conductive region 33ce, and shortening the channel length of the first channel region 33chd closer to the high potential electrode side among the first channel region 33chd and the second channel region 33chs. In particular, by using the drive transistor TR1 according to the present embodiment as the transistor for allowing the current to flow through the light-emitting element 20 emitted by the current driving, the current can stably flow through the light-emitting element 20, and the light-emitting element 20 can stably emit light.

Figure 8:
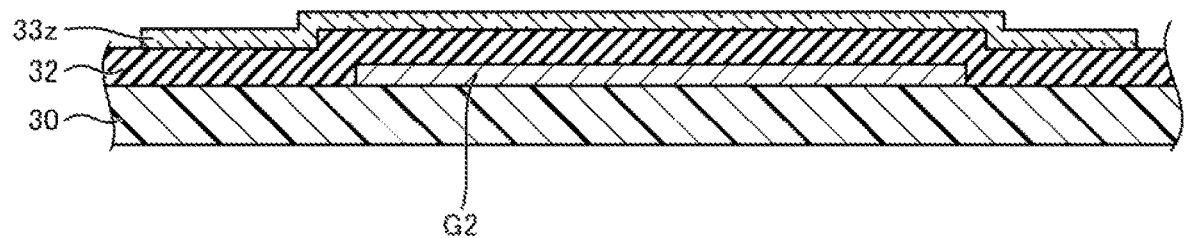
FIG. 8 is a cross-sectional view illustrating a base material in which up to a semiconductor layer is formed in a manufacturing process of the display device according to the embodiment.
Figure 9:
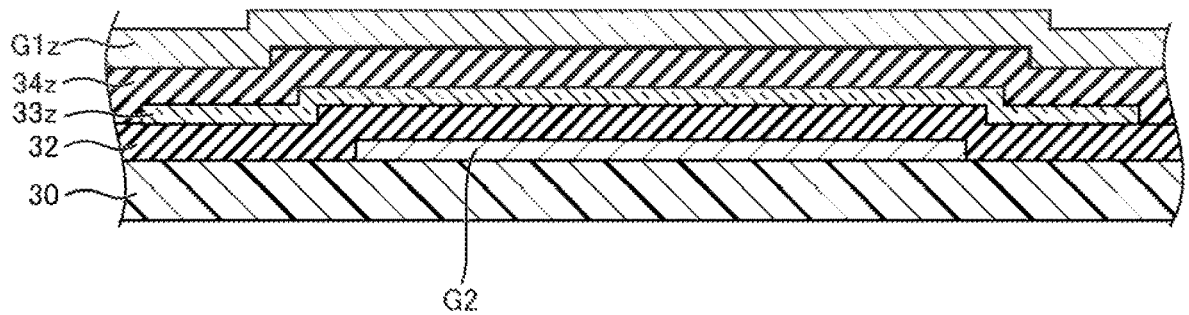
FIG. 9 is a cross-sectional view illustrating the base material in which up to a conductive layer for forming a first gate electrode is formed in the manufacturing process of the display device according to the embodiment.
Figure 10:
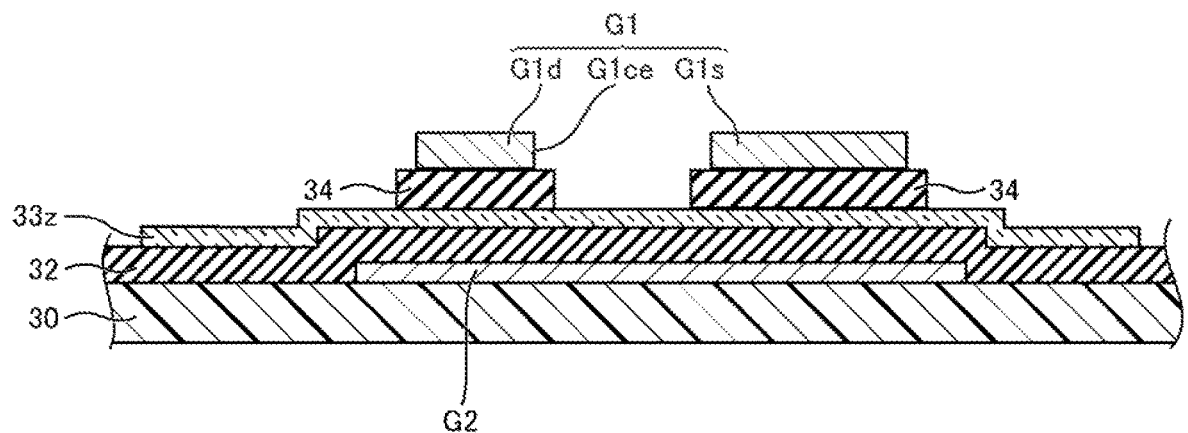
FIG. 10 is a cross-sectional view illustrating the base material in which up to the first gate electrode is formed in the manufacturing process of the display device according to the embodiment.
Figure 11:
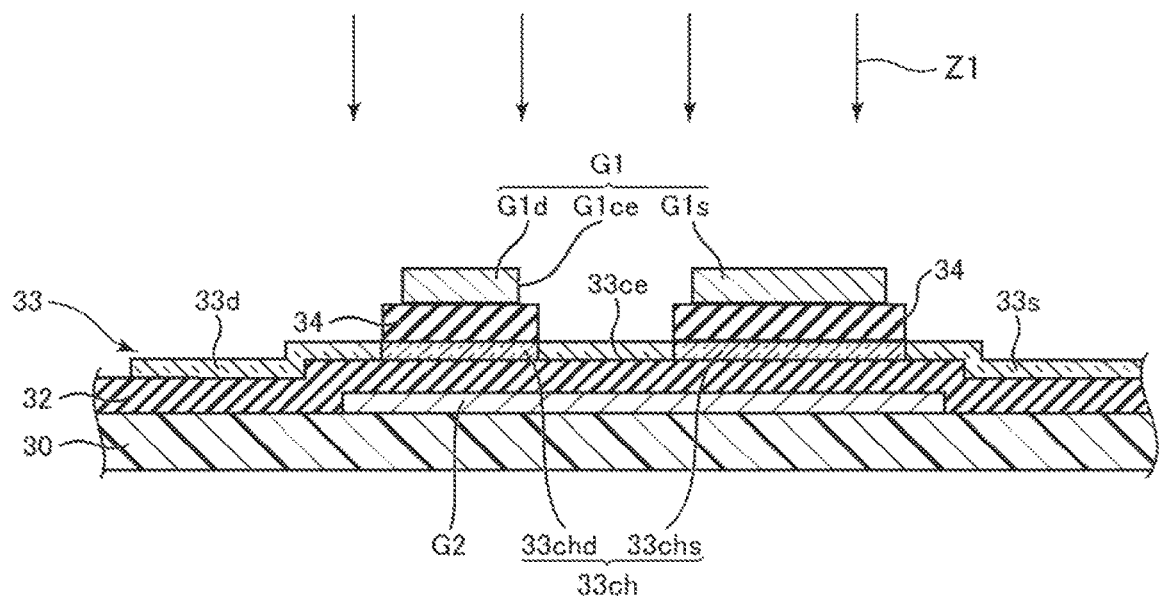
FIG. 11 is a cross-sectional view illustrating the base material in the middle of reducing resistance of the semiconductor layer in the manufacturing process of the display device according to the embodiment.

Next, with reference to FIGS. 3 and 8 to 11, the manufacturing process of the display device 1 will be described. FIG. 8 is a cross-sectional view illustrating the base material 30 in which up to a semiconductor layer 33z is formed in the manufacturing process of the display device 1 according to the present embodiment. FIG. 9 is a cross-sectional view illustrating the base material 30 in which up to a conductive layer G1z for forming the first gate electrode G1 is formed in the manufacturing process of the display device 1 according to the present embodiment. FIG. 10 is a cross-sectional view illustrating the base material 30 in which up to the first gate electrode G1 is formed in the manufacturing process of the display device 1 according to the present embodiment. FIG. 11 is a cross-sectional view illustrating the base material 30 in the middle of reducing resistance of the semiconductor layer 33 in the manufacturing process of the display device 1 according to the present embodiment.

The manufacturing process of the display device 1 includes, for example, forming the drive transistor TR1 and forming the light-emitting element 20 driven by the drive transistor TR1. Each process will be described below.

As illustrated in FIG. 8, the second gate electrode G2 is formed on the base material 30, for example, by sputtering or the like using a conductive material. Examples of the conductive material include metal materials such as aluminum, tungsten, molybdenum, tantalum, chromium, titanium, and copper, or an alloy thereof.

Next, the first insulating layer 32 is formed on the entire surface of the base material 30 to cover the second gate electrode G2, for example, by chemical vapor deposition (CVD), for example, using an inorganic insulating material. Examples of the inorganic insulating material include, for example, silicon nitride, silicon oxide, and silicon oxynitride.

Next, the semiconductor layer 33z is formed in the same shape as the semiconductor layer 33 on the first insulating layer 32 to overlap a part of the second gate electrode G2 via the first insulating layer 32, for example, by photolithography and etching, for example using an oxide semiconductor material. The semiconductor layer 33z is a layer to be the semiconductor layer 33 in the subsequent process, and at this point, the entire region is not reduced in resistance. The oxide semiconductor material includes a material containing, for example, at least one metal element selected from In, Ga, and Zn.

Next, as illustrated in FIG. 9, an insulating layer 34z is formed on the entire surface of the first insulating layer 32 to cover the semiconductor layer 33z, for example, by chemical vapor deposition (CVD), using an inorganic insulating material. The insulating layer 34z is a layer to be the gate insulating layer 34 in the subsequent process. Examples of the inorganic insulating material include, for example, silicon nitride, silicon oxide, and silicon oxynitride.

Next, the conductive layer G1z is formed on the entire surface of the insulating layer 34z, for example, by sputtering, using a conductive material. The conductive layer G1z is a layer to be the first gate electrode G1 in the subsequent process. Examples of the conductive material include metal materials such as aluminum, tungsten, molybdenum, tantalum, chromium, titanium, and copper, or an alloy thereof.

Next, as illustrated in FIG. 10, an unnecessary part of the conductive layer G1z is removed, for example, by photolithography and dry etching to form the first gate electrode G1. When the unnecessary part of the conductive layer G1z is removed, an unnecessary part of the insulating layer 34z is also removed using the first gate electrode G1 as a mask. As a result, the gate insulating layer 34 having a shape corresponding to the first gate electrode G1 is formed under the first gate electrode G1.

The first gate electrode G1 is formed so as to have a dual gate structure including, in a region overlapping the semiconductor layer 33z, the first region G1d close to an electrode having the high potential and the second region G1s separated from the first region G1d via the notch G1ce. The gate insulating layer 34 is also formed, corresponding to the first gate electrode G1, so as to have a shape including, in a region overlapping the semiconductor layer 33z, the first region close to the electrode having the high potential and the second region separated from the first region via the notch. The first gate electrode G1 is formed such that a length of the first region G1d in the channel direction X1 is shorter than a length of the second region G1s in the channel direction X1.

Next, as illustrated in FIG. 11, the semiconductor layer 33 is formed, from the semiconductor layer 33z, on the entire surface of the base material 30 by performing plasma processing as indicated by arrows Z1. Examples of the plasma processing include, for example, hydrogen plasma processing and He plasma processing.

During performing the plasma processing, the first gate electrode G1 serves as a mask, and a region of the semiconductor layer 33z overlapping the first gate electrode G1 is not reduced in resistance, and the channel region 33ch is formed. In other words, the first channel region 33chd is formed in a region of the semiconductor layer 33z overlapping the first region G1d of the first gate electrode G1, and the second channel region 33chs is formed in a region of the semiconductor layer 33z overlapping the second region G1s of the first gate electrode G1.

During performing the plasma processing, a region of the semiconductor layer 33z not overlapping the first gate electrode G1 is reduced in resistance. As a result, the drain region 33d, the conductive region 33ce, and the source region 33s, which are the conductive regions are formed.

As a result, the semiconductor layer 33 including the channel region 33ch is formed in the semiconductor layer 33z. The channel region 33ch includes the first channel region 33chd close to the electrode having the high potential and the second channel region 33chs separated from the first channel region 33chd via the conductive region 33ce. The length of the first channel region 33chd in the channel direction X1 is formed to be shorter than the length of the second channel region 33chs in the channel direction X1.

Next, as illustrated in FIG. 3, the second insulating layer 35 is formed on the entire surface of the first insulating layer 32 so as to cover the semiconductor layer 33 and the first gate electrode G1, for example, by chemical vapor deposition (CVD) using an inorganic insulating material. Examples of the inorganic insulating material include, for example, silicon nitride, silicon oxide, and silicon oxynitride.

Next, a contact hole is formed in the second insulating layer 35 so as to overlap a part of the drain region 33d and the source region 33s of the semiconductor layer 33. Next, the drain electrodes D1 and the source electrodes S1 are formed on the second insulating layer 35, for example, by sputtering using a conductive material. Examples of the conductive material include metal materials such as aluminum, tungsten, molybdenum, tantalum, chromium, titanium, and copper, or an alloy thereof.

Accordingly, the drain electrode D1, which is an upper layer of the second insulating layer 35, is electrically connected to the drain region 33d, which is a lower layer of the second insulating layer 35, through the contact hole in the second insulating layer 35. The source electrodes S1 of the upper layer of the second insulating layer 35 is also electrically connected to the source region 33s, which is a lower layer of the second insulating layer 35.

With this, the drive transistor TR1 is completed. Note that the selection transistor TR2 illustrated in FIG. 2 can be formed in the similar manner to the drive transistor TR1.

Next, the flattened layer 36 is formed on the entire surface of the second insulating layer 35 so as to cover the drain electrode D1 and the source electrode S1, for example, by application of an organic material. Examples of the organic material include a resin material such as a polyimide resin and an acrylic resin.

With this, an active matrix substrate including the drive transistor TR1 and the selection transistor TR2 is completed.

Thereafter, a contact hole is formed in the flattened layer 36, and the first electrode 21 is formed on the flattened layer 36. Accordingly, the first electrode 21, which is an upper layer of the flattened layer 36, is electrically connected to the source electrode S1, which is a lower layer of the flattened layer 36, through the contact hole in the flattened layer 36. Next, the edge cover 37 is formed so as to be the upper layer of the flattened layer 36 and to cover the peripheral portion (edge portion) of the first electrode 21. Then, the first charge injection layer 22, the light-emitting layer 23, and the second charge injection layer 24 are formed in order on the first electrode 21. Next, the second electrode 25 is formed so as to cover the edge cover 37 and the second charge injection layer 24. Accordingly, the light-emitting element 20 is completed.

Then, a sealing layer (not illustrated) is formed on the second electrode 25, and various circuit components are mounted in the frame region or the like. This completes the display device 1.

Figure 12:
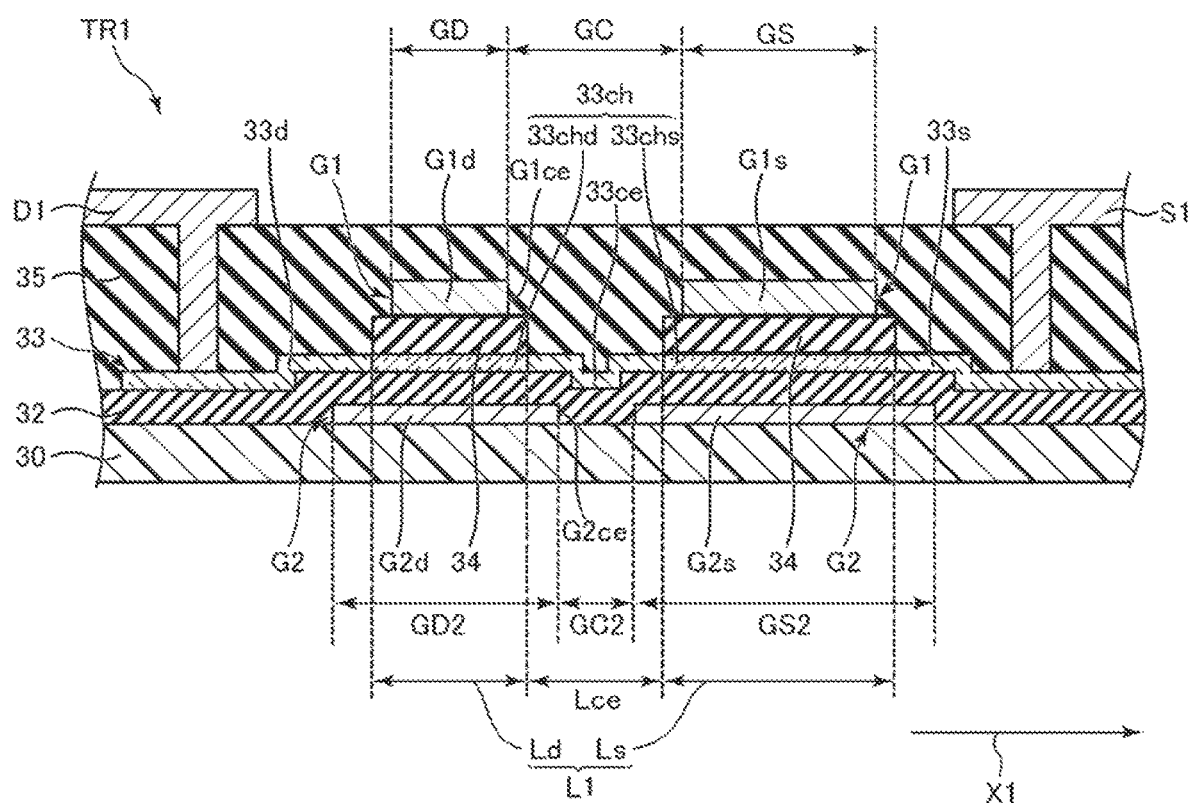
FIG. 12 is a cross-sectional view illustrating a schematic configuration of the drive transistor in the display device according to a first modified example of the embodiment.
Figure 13:
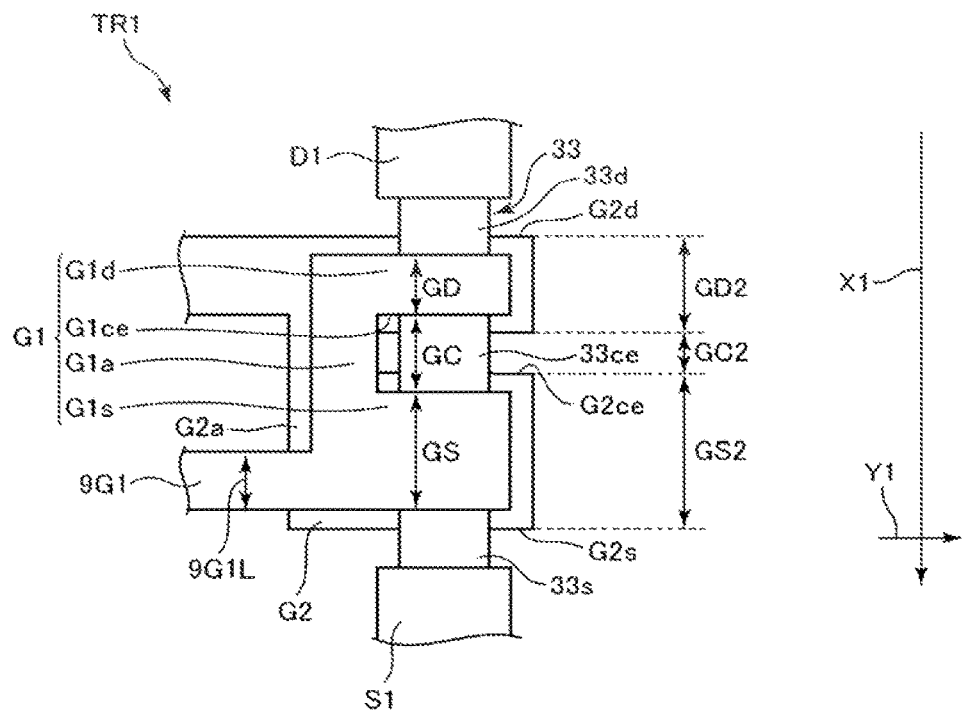
FIG. 13 is a plan view illustrating a schematic configuration of the drive transistor illustrated in FIG. 12.

FIG. 12 is a cross-sectional view illustrating a schematic configuration of the drive transistor TR1 in the display device 1 according to a first modified example of the embodiment. FIG. 13 is a plan view illustrating a schematic configuration of the drive transistor TR1 illustrated in FIG. 12. In the drive transistor TR1, a notch may be provided also in the second gate electrode G2.

As illustrated in FIGS. 12 and 13, the second gate electrode G2 includes a base portion G2a electrically connected to the wiring line and a first region G2d and a second region G2s protruding from the base portion G2a so as to intersect the semiconductor layer 33 in a plan view. The second gate electrode G2 has a dual gate structure including, in a region overlapping the semiconductor layer 33, a first region G2d close to the drain electrode D1 having the high potential and a second region G2s separated from the first region G2d via a notch G2ce. The length GD2 of the first region G2d in the channel direction X1 is shorter than the length GS2 of the second region G2s in the channel direction X1.

The first region G2d in the second gate electrode G2 overlaps the first region G1d and the first channel region 33chd of the first gate electrode G1. The second region G2s in the second gate electrode G2 overlaps the second region G1s and the second channel region 33chs of the first gate electrode G1. The notch G2ce in the second gate electrode G2 overlaps the notch G1ce of the first gate electrode G1 and the conductive region 33ce of the semiconductor layer 33.

According to the drive transistor TR1 illustrated in FIGS. 12 and 13, the first region G2d and the second region G2s of the second gate electrode G2 are separated from each other in the channel direction X1. Thus, as compared with a case where the second gate electrode is not separated into the plurality of regions, an electric field between the first region G2d of the second gate electrode G2 and the first region G1d of the first gate electrode G1 and an electric field between the second region G2s of the second gate electrode G2 and the second region G1s of the first gate electrodes G1 act in a direction in which the electric fields are separated from each other. Thus, the effect of suppressing the current change with respect to the voltage change can be further enhanced.

The second gate electrode G2 covers the lower layer of the first gate electrode G1 via the semiconductor layer 33, and is larger than the area of the first gate electrode G1.

In other words, the length GD2 of the first region G2d in the second gate electrode G2 in the channel direction X1 is longer than the length GD of the first region G1d in the first gate electrode G1 in the channel direction X1. The length GS2 of the second region G2s in the second gate electrode G2 in the channel direction X1 is longer than the length GS of the second region G1s in the first gate electrode G1 in the channel direction X1. In other words, the length GC2 of the notch G2ce in the second gate electrode G2 in the channel direction X1 is shorter than the length GC of the notch G1ce in the first gate electrode G1 in the channel direction X1.

As a result, the voltage between the first gate electrode G1 and the second gate electrode G2 can be stabilized. As a result, the light-emitting element 20 can stably emit light.

Figure 14:
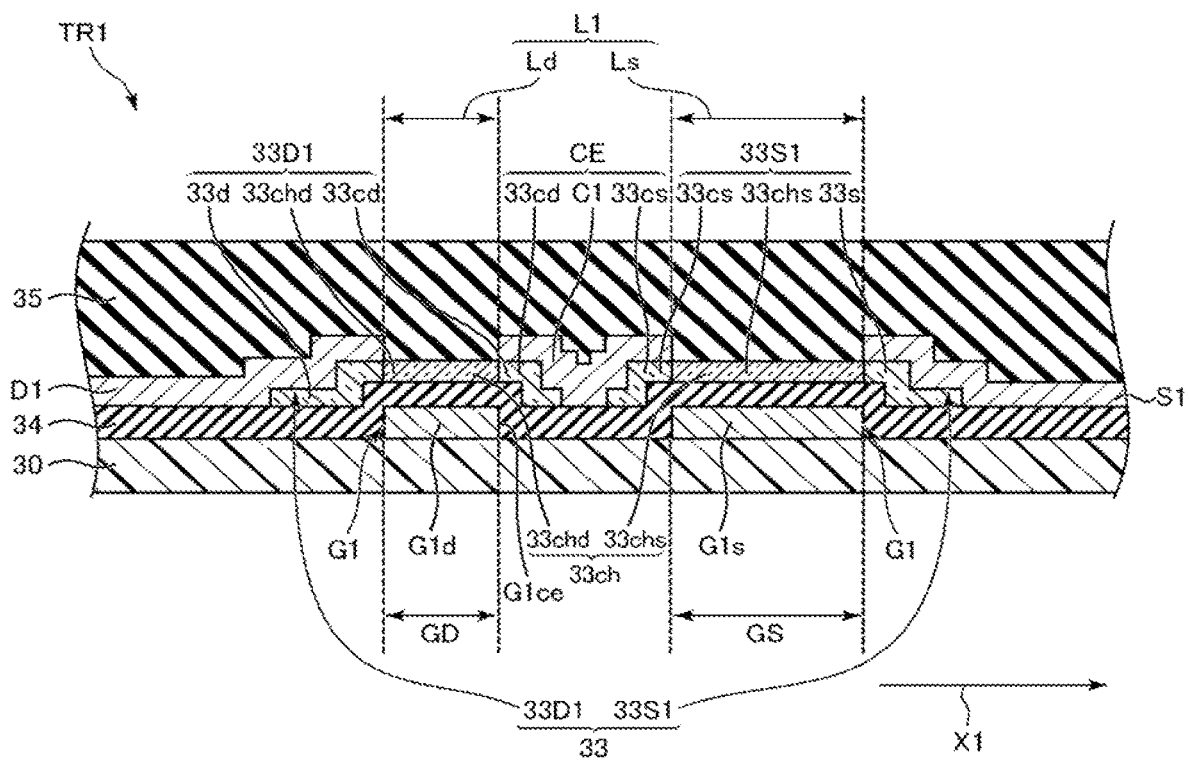
FIG. 14 is a cross-sectional view illustrating a schematic configuration of the drive transistor in the display device according to a second modified example of the embodiment.
Figure 15:
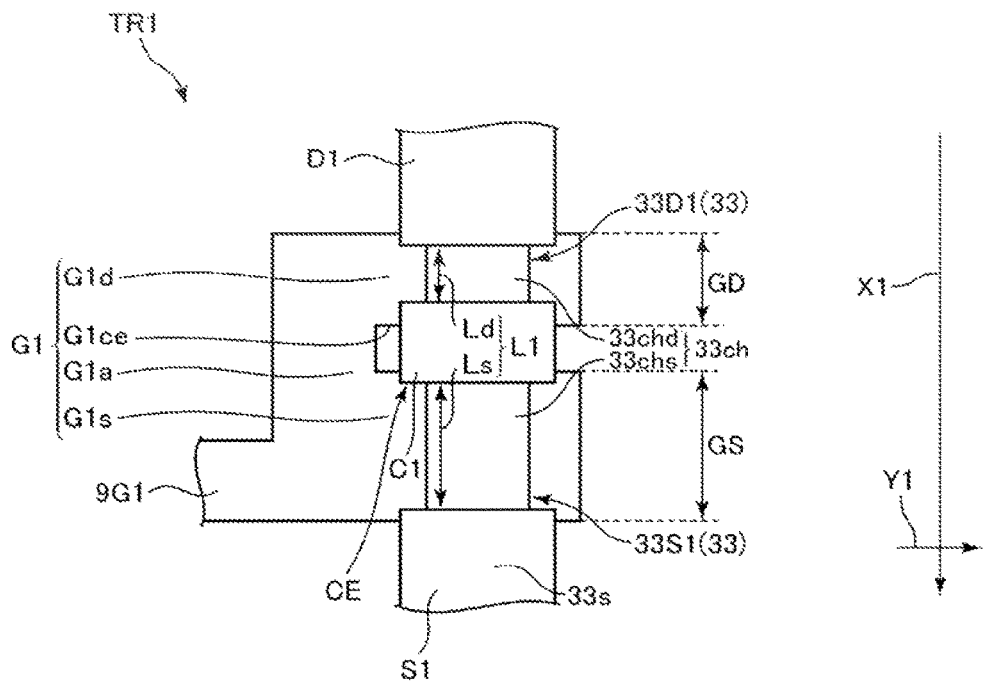
FIG. 15 is a plan view illustrating a schematic configuration of the drive transistor illustrated in FIG. 14.

FIG. 14 is a cross-sectional view illustrating a schematic configuration of the drive transistor TR1 in the display device 1 according to a second modified example of the embodiment. FIG. 15 is a plan view illustrating a schematic configuration of the drive transistor TR1 illustrated in FIG. 14. As illustrated in FIGS. 14 and 15, the drive transistor TR1 may have a bottom gate structure.

As illustrated in FIGS. 14 and 15, the first gate electrode G1 is provided on the base material 30. The gate insulating layer 34 is provided on the entire surface of the main surface on the base material 30 so as to cover the first gate electrode G1. The semiconductor layer 33 is provided on the gate insulating layer 34 and extends in the channel direction X1 so as to overlap the first gate electrode G1. The semiconductor layer 33 includes a first semiconductor layer 33D1 and a second semiconductor layer 33S1 separated from the first semiconductor layer 33D1. The first semiconductor layer 33D1 includes the first channel region 33chd overlapping the first region G1d in the first gate electrode G1, the drain region 33d closer to the drain electrode D1 side than the first channel region 33chd, and the first conductive region 33cd closer to the source electrode S1 side than the first channel region 33chd. The second semiconductor layer 33S1 includes the second channel region 33chs overlapping the second region G1s in the first gate electrode G1, and a second conductive region 33cs closer to the drain electrode D1 side than the second channel region 33chs, and the source region 33s closer to the source electrode S1 side than the second channel region 33chs. The first conductive region 33cd of the first semiconductor layer 33D1 and the second conductive region 33cs of the second semiconductor layer 33S1 are separated from each other.

The drain region 33d, the first conductive region 33cd, the second conductive region 33cs, and the source region 33s are conductive regions where the semiconductor layer 33, which is the oxide semiconductor, is reduced in resistance. The first channel region 33chd and the second channel region 33chs are semiconductor regions where the semiconductor layer 33, which is the oxide semiconductor, is not reduced in resistance.

The drain electrode (high-potential side electrode) D1 is provided across on the gate insulating layer 34 and on the drain region 33d of the first semiconductor layer 33D1. The source electrode (low-potential side electrode) S1 is provided across on the gate insulating layer 34 and on the source region 33s of the second semiconductor layer 33S1.

The conductive layer C1 is provided across on the first conductive region 33cd of the first semiconductor layer 33D1, on the second conductive region 33cs of the second semiconductor layer 33S1, and on the gate insulating layer 34 between the first conductive region 33cd and the second conductive region 33cs. The first conductive region 33cd, the second conductive region 33cs, and the conductive layer C1 are collectively referred to as a conductive region CE. The first channel region 33chd of the first semiconductor layer 33D1 and the second channel region 33chs of the second semiconductor layer 33S1 are electrically connected to each other via the conductive region CE.

The first semiconductor layer 33D1 and the second semiconductor layer 33S1 may be directly connected to each other without being separated from each other. However, as compared with the case where the first semiconductor layer and the second semiconductor layer are not separated from each other, a contact area between the conductive region CE and each of the first semiconductor layer 33D1 and the second semiconductor layer 33S1 can be reduced by separating the first semiconductor layer 33D1 and the second semiconductor layer 33S1 from each other. As a result, even when the adhesion between the conductive region CE and each of the first semiconductor layer 33D1 and the second semiconductor layer 33S1 is poor, occurrence of a defect such as separation between the conductive region CE and each of the first semiconductor layer 33D1 and the second semiconductor layer 33S1 can be suppressed.

The second insulating layer 35 covers the drain electrode D1, the first semiconductor layer 33D1, the conductive layer C1, the second semiconductor layer 33S1, and the source electrode S1, and is provided on the entire surface on the gate insulating layer 34.

Note that although not illustrated in FIG. 14, the source electrode S1, which is the lower layer of the second insulating layer 35, and the first electrode 21 (see FIG. 3), which is the upper layer of the second insulating layer 35, are electrically connected to each other through the contact hole provided in the second insulating layer 35.

The first gate electrode G1 has a dual gate structure including, in a region overlapping the first semiconductor layer 33D1, the first region G1d close to the drain electrode D1 and the second region G1s separated from the first region G1d via the notch G1ce. The length GD of the first region G1d in the channel direction X1 is shorter than the length GS of the second region G1s in the channel direction X1.

The semiconductor layer 33 includes the first channel region 33chd close to the drain electrode D1 and the second channel region 33chs separated from the first channel region 33chd via the conductive region CE. The length Ld of the first channel region 33chd in the channel direction X1 is shorter than the length Ls of the second channel region 33chs in the channel direction X1. The length L1 of the channel region 33ch of the semiconductor layer 33 in the channel direction X1 is a length including the length Ld of the first channel region 33chd and the length Ls of the second channel region 33chs.

Also in the display device 1 according to the second modified example, the current change with respect to the voltage change of the drive transistor TR1 can be suppressed, and the shift amount of the threshold voltage can be suppressed.

Figure 16:
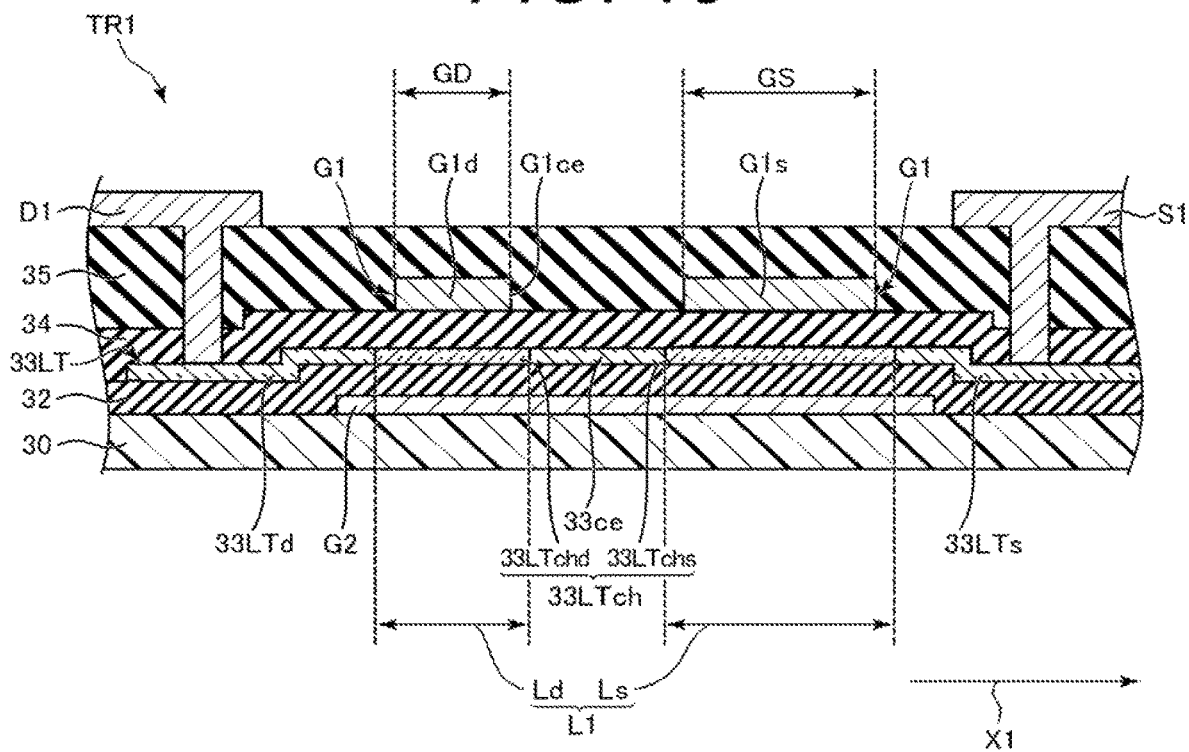
FIG. 16 is a cross-sectional view illustrating a schematic configuration of the drive transistor in the display device according to a third modified example of the embodiment.
Figure 17:
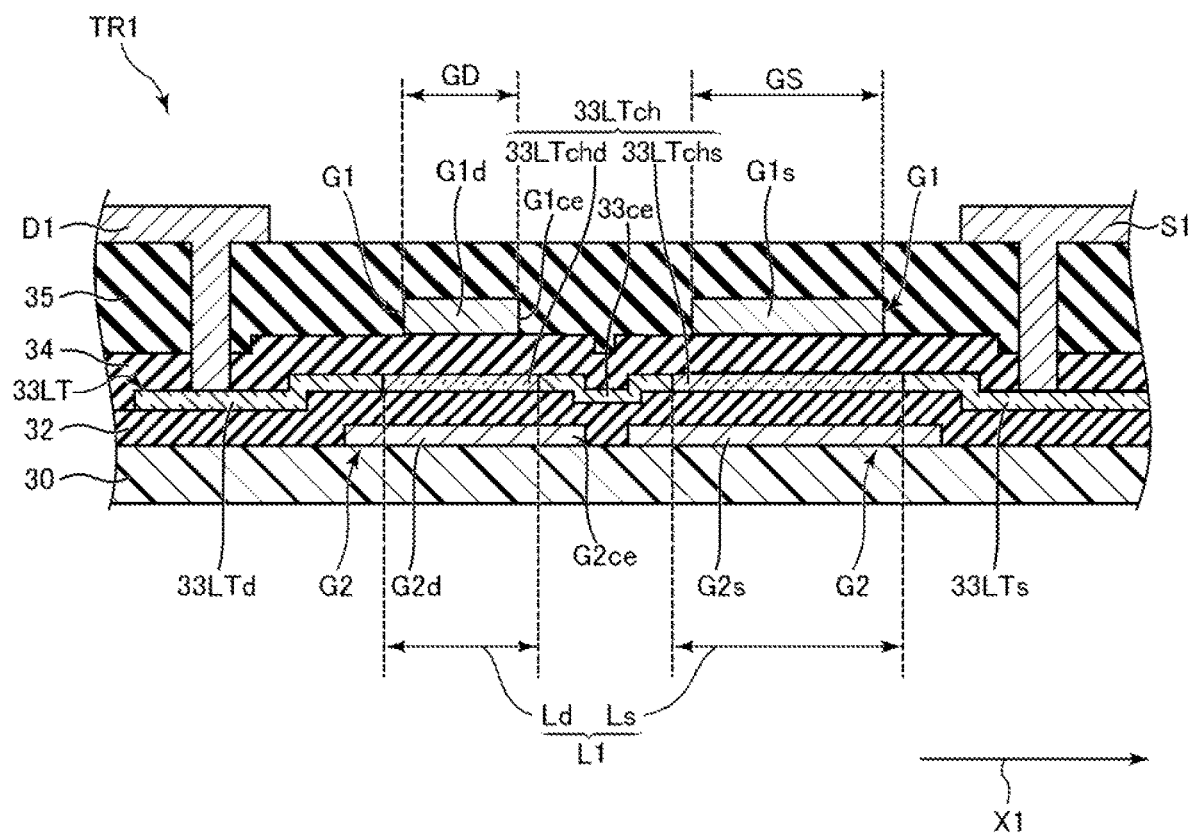
FIG. 17 is a cross-sectional view illustrating a schematic configuration of the drive transistor in the display device according to a fourth modified example of the embodiment.

FIG. 16 is a cross-sectional view illustrating a schematic configuration of the drive transistor TR1 of the display device 1 according to a third modified example of the embodiment. FIG. 17 is a cross-sectional view illustrating a schematic configuration of the drive transistor TR1 of the display device 1 according to a fourth modified example of the embodiment.

The drive transistor TR1 illustrated in FIGS. 16 and 17 has a configuration in which a semiconductor layer 33LT formed of a low-temperature polysilicon is used for the semiconductor layer 33 formed of the oxide semiconductor from the drive transistor TR1 illustrated in FIG. 4. In the drive transistor TR1 illustrated in FIGS. 16 and 17, the gate insulating layer 34 covers the semiconductor layer 33LT and is provided on the entire surface on the first insulating layer 32. The drive transistor TR1 illustrated in FIG. 17 has a configuration in which the second gate electrode G2 of the drive transistor TR1 illustrated in FIG. 16 is separated in the channel direction X1. Other configurations of the drive transistor TR1 illustrated in FIGS. 16 and 17 are similar to the configuration of the drive transistor TR1 illustrated in FIG. 4.

As illustrated in FIGS. 16 and 17, the drive transistor TR1 may use, for example, the semiconductor layer 33LT formed of the low-temperature polysilicon.

The semiconductor layer 33LT includes a first channel region 33LTchd close to the drain electrode D1, a second channel region 33LTchs separated from the first channel region 33LTchd via the conductive region 33ce, a drain side conductive region 33LTd connected to the drain electrode D1, and a source side conductive region 33LTs connected to the source electrode S1. The length Ld of the first channel region 33LTchd in the channel direction X1 is shorter than the length Ls of the second channel region 33LTchs in the channel direction X1. The length L1 of the channel region 33LTch of the semiconductor layer 33LT in the channel direction X1 is a length including the length Ld of the first channel region 33LTchd and the length Ls of the second channel region 33LTchs.

The first gate electrode G1 has a dual gate structure including, in a region overlapping the semiconductor layer 33LT, the first region G1d close to the drain electrode D1 and the second region G1s separated from the first region G1d via the notch G1ce. The length GD of the first region G1d in the channel direction X1 is shorter than the length GS of the second region G1s in the channel direction X1.

The drive transistors TR1 according to the third modified example and the fourth modified example, can also suppress the current change with respect to the voltage change, and can suppress the shift amount of a threshold voltage.

The second gate electrode G2 of the drive transistor TR1 illustrated in FIG. 17 has a similar configuration to the second gate electrode G2 illustrated in FIGS. 12 and 13. The first region G2d in the second gate electrode G2 illustrated in FIG. 17 overlaps the first region G1d and the first channel region 33LTchd of the first gate electrode G1. The second region G2s in the second gate electrode G2 overlaps the second region G1s and the second channel region 33LTchs of the first gate electrode G1. The notch G2ce in the second gate electrode G2 overlaps the notch G1ce of the first gate electrode G1 and the conductive region 33ce of the semiconductor layer 33. The drive transistor TR1 illustrated in FIG. 17 can further enhance the effect of suppressing the current change with respect to the voltage change.

Note that also in the drive transistors TR1 according to the second to fourth modified examples (FIGS. 14 to 17), the first gate electrode G1 need not be configured to be provided with the notch G1ce nor to be separated into the first region G1d and the second region G1s. With this, the drive transistor TR1 can also suppress the current change with respect to the voltage change, and can suppress the shift amount of the threshold voltage as compared with the transistor in which the semiconductor layer is not separated in the channel direction.

The elements described in the above-described embodiments and the modified examples may be appropriately combined in a range in which a contradiction does not arise.

REFERENCE SIGNS LIST

1 Display device
10 Pixel circuit
20 Light-emitting element
21 First electrode
23 Light-emitting layer
25 Second electrode
30 Base material
32 First insulating layer
33 Semiconductor layer
33cd First conductive region
33ce Conductive region
33ch Channel region
33chd First channel region
33chs Second channel region
33cs Second conductive region
33d Drain region
33D1 First semiconductor layer
33LT Semiconductor layer
33LTch Channel region
33LTchd First channel region
33LTchs Second channel region
33s Source region
33S1 Second semiconductor layer
33z Semiconductor layer
34 Gate insulating layer
35 Second insulating layer
36 Flattened layer
37 Edge cover
C1 Conductive layer
CE Conductive region
D1 Drain electrode
G1 First gate electrode
G1a Base portion
G1d First region
G1s Second region
G1z Conductive layer
G2 Second gate electrode
G2a Base portion
G2d First region
G2s Second region
PX Pixel
S1 Source electrode (high-potential side electrode)
TR1 Drive transistor
TR2 Selection transistor

The invention claimed is:
1. A display device comprising:
a light-emitting element including a first electrode, a second electrode, and a light-emitting layer provided between the first electrode and the second electrode; and
a drive transistor configured to drive the light-emitting element,
wherein the drive transistor includes a source electrode, a drain electrode, a semiconductor layer, and a first gate electrode,
one of the source electrode and the drain electrode is electrically connected to the first electrode, the semiconductor layer includes a first channel region close to a high-potential side electrode having a high potential among the source electrode and the drain electrode, and a second channel region separated from the first channel region via a conductive region, and when a direction from the source electrode to the drain electrode is referred to as a channel direction, a length of the first channel region in the channel direction is shorter than a length of the second channel region in the channel direction.

2. The display device according to claim 1, wherein the first gate electrode has a dual gate structure including, in a region overlapping the semiconductor layer, a first region close to the high-potential side electrode and a second region separated from the first region via a notch, and a length of the first region in the channel direction is shorter than a length of the second region in the channel direction.

3. The display device according to claim 2, wherein the first gate electrode includes a base portion electrically connected to a wiring line, and the first region and the second region protrude from the base portion to intersect the semiconductor layer in a plan view.

4. The display device according to claim 1, wherein the drive transistor further includes a second gate electrode provided on a side of the semiconductor layer facing away from the first gate electrode.

5. The display device according to claim 4, wherein an area of a region overlapping the semiconductor layer is larger for the second gate electrode than the first gate electrode.

6. The display device according to claim 4, wherein the second gate electrode has a dual gate structure including, in a region overlapping the semiconductor layer, a third region close to the high-potential side electrode and a fourth region separated from the third region via a notch.

7. The display device according to claim 1, wherein a length of the first gate electrode in a direction orthogonal to the channel direction is longer than a length of the semiconductor layer in the direction orthogonal to the channel direction.

8. The display device according to claim 7, wherein a length of a notch in the first gate electrode in the direction orthogonal to the channel direction is longer than a length of the semiconductor layer in the direction orthogonal to the channel direction.

9. The display device according to claim 1, wherein the length of the first channel region in the channel direction is 3 μm or greater and 10 μm or less.

10. The display device according to claim 1, wherein the length of the second channel region in the channel direction is 1.5 times of the length of the first channel region.

11. The display device according to claim 1, wherein a length of the conductive region in the channel direction is 2 μm or greater and 4 μm or less.

12. The display device according to claim 1, wherein the drive transistor has a top gate structure.

13. The display device according to claim 1, wherein the semiconductor layer further includes the conductive region.

14. The display device according to claim 1, wherein the semiconductor layer is formed of an oxide semiconductor.

15. The display device according to claim 1, wherein the semiconductor layer is formed of low-temperature polysilicon.

16. A method for manufacturing a display device, the method comprising:

forming a drive transistor; and forming a light-emitting element driven by the drive transistor, wherein forming the drive transistor includes;
  forming a semiconductor layer,
  forming a first gate electrode,
  forming a drain electrode and a source electrode, and
  forming a channel region in the semiconductor layer, forming the light-emitting element includes;
  forming a first electrode electrically connected to one of the source electrode and the drain electrode,
  forming a light-emitting layer overlapping the first electrode, and
  forming a second electrode, the light-emitting layer being between the first electrode and the second electrode, forming the channel region includes forming, in the semiconductor layer, a first channel region close to a high-potential side electrode having a high potential among the source electrode and the drain electrode, and a second channel region separated from the first channel region via a conductive region, and when a direction from the source electrode to the drain electrode is referred to as a channel direction, the first channel region having a length in the channel direction shorter than a length of the second channel region in the channel direction is formed.

17. The method according to claim 16, wherein, in forming the first gate electrode;
  the first gate electrode, including a first region close to the high-potential side electrode and a second region separated from the first region via a notch, is formed in a region overlapping the semiconductor layer, and
  the first region is formed to have a length in the channel direction shorter than a length of the second region in the channel direction.

* * * * *